United States Patent [19]
Huang

[11] Patent Number: 5,869,837
[45] Date of Patent: Feb. 9, 1999

[54] RADIATION IMAGING PANEL

[75] Inventor: Zhong Huang, Ontario, Canada

[73] Assignee: Litton Systems Canada Limited, Rexdale, Canada

[21] Appl. No.: 776,140

[22] PCT Filed: Jul. 27, 1994

[86] PCT No.: PCT/CA94/00407

§ 371 Date: Mar. 31, 1997

§ 102(e) Date: Mar. 31, 1997

[87] PCT Pub. No.: WO96/03773

PCT Pub. Date: Feb. 8, 1996

[51] Int. Cl.[6] .................................................. G01T 1/24
[52] U.S. Cl. ...................................... 250/370.09; 378/98.8
[58] Field of Search ........................... 250/208.1, 370.09, 250/370.08, 580; 378/98.8

[56]  References Cited

U.S. PATENT DOCUMENTS

| | | |
|---|---|---|
| 4,651,001 | 3/1987 | Harada et al. ..................... 250/370.06 |
| 5,017,989 | 5/1991 | Street et al. . |
| 5,198,673 | 3/1993 | Rougeot et al. ................... 250/370.09 |
| 5,245,191 | 9/1993 | Barber et al. ..................... 250/370.09 |
| 5,254,480 | 10/1993 | Tran .................................. 250/370.09 |
| 5,262,649 | 11/1993 | Antonuk et al. .................. 250/370.09 |
| 5,276,329 | 1/1994 | Hughes ............................. 250/370.09 |
| 5,598,004 | 1/1997 | Powell et al. ........................... 250/580 |

*Primary Examiner*—Edward J. Glick
*Assistant Examiner*—Darren M. Jiron
*Attorney, Agent, or Firm*—Fay, Sharpe, Beall, Fagan, Minnich & McKee

[57]  ABSTRACT

A radiation imaging system comprising a capacitive coupling radiation detector for directly converting incidence radiation to electrical charges, a storage capacitor for storing the generated charges, a read-out switch for periodically outputting the charges stored on the storage capacitor, and a reset switch for periodically re-setting the radiation detector.

34 Claims, 11 Drawing Sheets

RADIATION IMAGING PANEL

FIELD OF THE INVENTION

This invention relates in general to imaging systems, and more particularly to an X-ray imaging panel incorporating a capacitive coupling radiation detector and a reset switch for periodically resetting the potential of the capacitive radiation detector.

BACKGROUND OF THE INVENTION

Amorphous selenium (a-Se) has recently been recognized as a promising material for digital X-ray imaging devices for medical and industrial applications. One such prior art device has been described in a paper entitled "A Large Area Solid-State Detector for Radiology Using Amorphous Selenium", Medical Imaging VI: Instrumentation SPIE 1651, pages 134–143 (1992). This article describes a digital X-ray imaging device in which a high voltage is applied to a selenium (Se) plate to obtain high conversion efficiency of X-rays. Depending on the thickness of the Se film, the DC bias voltage may be over several thousand volts. The use of high voltage on the Se film poses serious risks to any semiconductor device connected to the X-ray conversion plate.

One approach to avoiding such risks involves separating the high voltage parts from the signal detection circuits by inserting an insulator between the readout circuit and Se film. X-ray imaging devices comprising an Se film and insulator (electrode/Se/insulator/readout circuit or readout circuit/Se/insulator/electrode) are described in a paper entitled "A Method of Electronic Readout of Electrophotographic and Electroradiographic Images" D. M. Korn et al, Journal of Applied Photographic Engineering vol. 4, no. 4, Fall 1978, and a paper entitled "Laser Readout of Electrostatic Images", by A Zermeno et al, SPIE vol. 173, Application of Optical Instrumentation and Medicine VII, pages 81–87 (1979). Furthermore, U.S. Pat. No. 5,017,989 (R. A. Street), issued to Xerox Corporation, discloses a configuration of electrode/Se/insulator/readout circuits. In this prior art patent, an improvement is identified in the use of a thin film transistor (TFT) circuit which is overlaid on the insulation film to amplify and output the imaging signal.

In all of the prior art devices referred to above, a signal voltage is capacitively coupled to the readout circuit. Thus, the readout circuit is not capable of resetting the potential of the Se film automatically (i.e. non-destructive readout). After readout, the bias voltage-of the Se film must be inverted, in order to make the signal charge reverse, thereby resetting the potential of the Se film and preparing the panel for the next X-ray exposure.

A significant disadvantage of each of the above-referenced prior art devices is that they are substantially incapable of performing real-time acquisition of X-ray images (i.e. incapable of attaining high speed operation to obtain a video rate signal (e.g. 30 frames/second)).

This disadvantage is caused by two reasons which are discussed in greater detail below under the heading "Detailed Description of the Preferred Embodiment and Further Description of the Prior Art".

SUMMARY OF THE INVENTION

According to the present invention, a high readout speed, real-time radiation imaging panel is provided in which a switch is connected to the radiation sensing film (e.g. a-Se) and to a source of reset potential for resetting the radiation sensing film. As a consequence, the radiation imaging panel of the present invention provides signal readout with high sensitivity and high speed response, in contrast with the known prior art. Furthermore, by incorporating a reset circuit with high voltage and large current tolerance, reliability of circuit operation is enhanced.

BRIEF DESCRIPTION OF THE DRAWINGS

A further description of the prior art and of the preferred embodiment is provided herein below with reference to the following drawings, in which.

DETAILED DESCRIPTION OF THE PREFERRED

Figure 1:
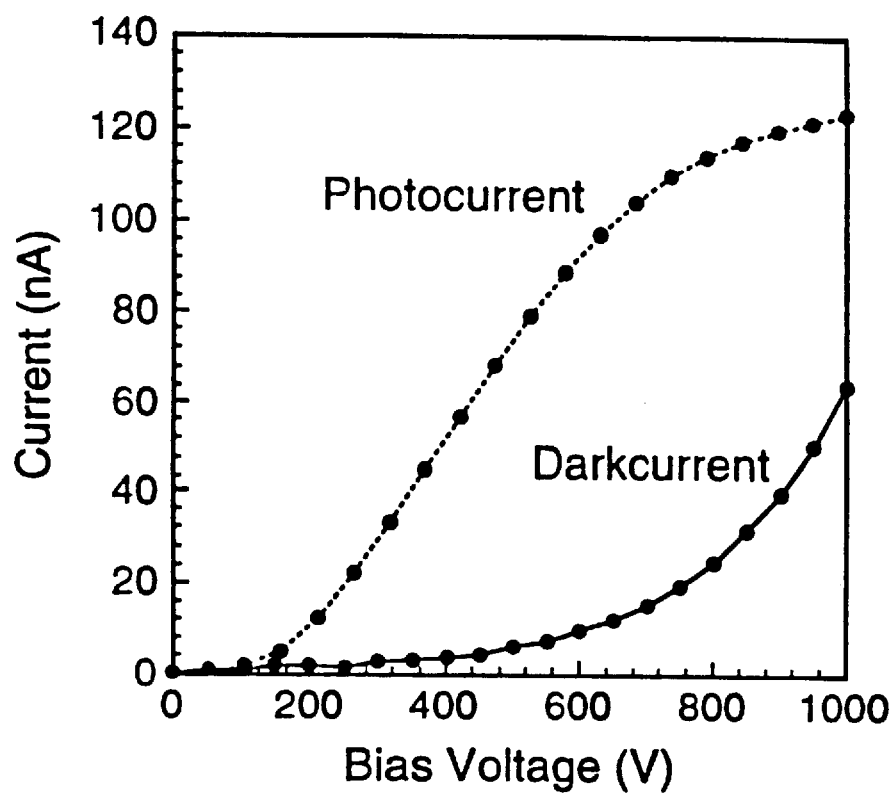
FIG. 1 is a graph showing photocurrent and dark current versus bias voltage applied across an Se film as known from the prior art.

Embodiment and Further Description of the Prior Art As discussed above, prior art digital X-ray imagers suffer from the disadvantage that they are incapable of attaining sufficiently high speed for real-time acquisition of X-ray images. There are two causes for this disadvantage in the prior art. Firstly, with reference to FIG. 1, a plot is provided of dark current and photocurrent versus bias voltage applied across an Se film, from which it will be noted that both photocurrent and dark current decrease dramatically with a decrease of bias voltage across the Se film. This suggests that a long time is required in order to discharge the Se film completely, or else a large decay-lag results. This characteristic is more serious in the case of low-dose X-rays, such as experienced during X-ray fluoroscopy or X-ray television. Secondly, it is difficult with the Se bias voltage circuit to switch the high bias voltage, e.g. from 2000 V to −2000 V at the video frequency of 30 Hz without introducing additional electronic noise or air discharging problems. Moreover, the high voltage pulse will feed into the signal readout circuits through the insulator. This is because the insulator inserted between the Se film and the readout circuits in prior art systems can only insulate the readout circuits from the electrostatic field or DC component of the electric field, and cannot insulate the readout circuits from electric fields that change with time (i.e. the AC component of the electric field). Therefore, the bias voltage on the Se film in such prior art devices must be changed slowly in order to reduce the differential voltage. Operating prior art devices in this fashion increases the response time.

Figure 2:
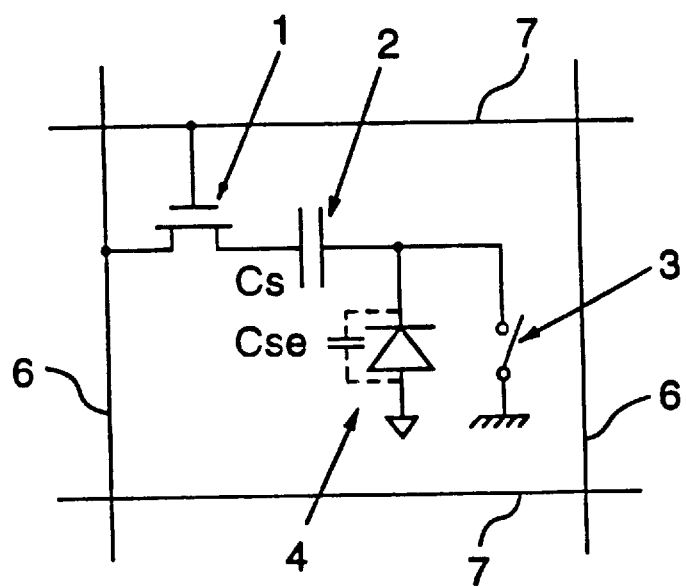
FIG. 2 is a schematic diagram of an equivalent circuit of a single pixel of an imaging array according to the present invention.

FIG. 2 depicts an equivalent circuit of a single pixel in an x-ray imaging array according to the present invention. The circuit comprises a readout switch 1 having a control terminal connected to one of a plurality of parallel control lines 7, an output terminal connected to one of a plurality of parallel data lines 6, and an input terminal connected to a storage capacitor 2 having capacitance Cs. The storage capacitor 2 is connected in turn to a radiation detector 4 and a reset switch 3. Where the radiation detector 4 comprises a thick film of Se, as in the preferred embodiment discussed in greater detail below, the capacitance may be represented as Cse.

In operation, a bias voltage is applied to the radiation detector 4 such that when exposed to radiation (e.g. X-rays), electrical charges (e.g. electrons and holes) are generated in the radiation detector and stored on capacitor 2. A vertical scanner (FIG. 3) generates control signals on successive ones of the control lines 7 for enabling successive rows of the readout switches of an array of pixels (e.g. FIG. 3), for discharging successive rows of the storage capacitors 2. The signal charge from each capacitor 2 is applied to a data line 6 for subsequent readout, as discussed in greater detail below with reference to FIG. 3.

The collection efficiency of signal charge is proportional to the ratio of the storage capacitance of capacitor 2 and the capacitance of the radiation detector 4 (i.e. where the radiation detector 4 is fabricated from Se, then the collection efficiency is given by Cs/(Cs+Cse)).

As discussed above, since the signal voltage is capacitively coupled to the readout switch 1, the readout switch cannot reset the potential of the radiation detector 4 automatically. Thus, in prior art systems, the bias voltage applied to the radiation detector 4 is inverted, in order to make the signal charges reverse, thereby resetting the potential of the radiation detector 4 (e.g. Se film).

However, according to the present invention, a switch 3 is connected to the radiation detector 4 and storage capacitor 2 for rapidly resetting the potential (i.e. bias voltage) across the radiation detector 4 to a predetermined voltage (e.g. ground or some other suitable reset voltage), thereby facilitating real-time operation of the sensor. As discussed in greater detail below, the switch 3 may be constructed as a TFT, diode, MIM (metal-insulator-metal) or MIS (metal-insulator-semiconductor) switch, or from other suitable switching technology.

Figure 3:
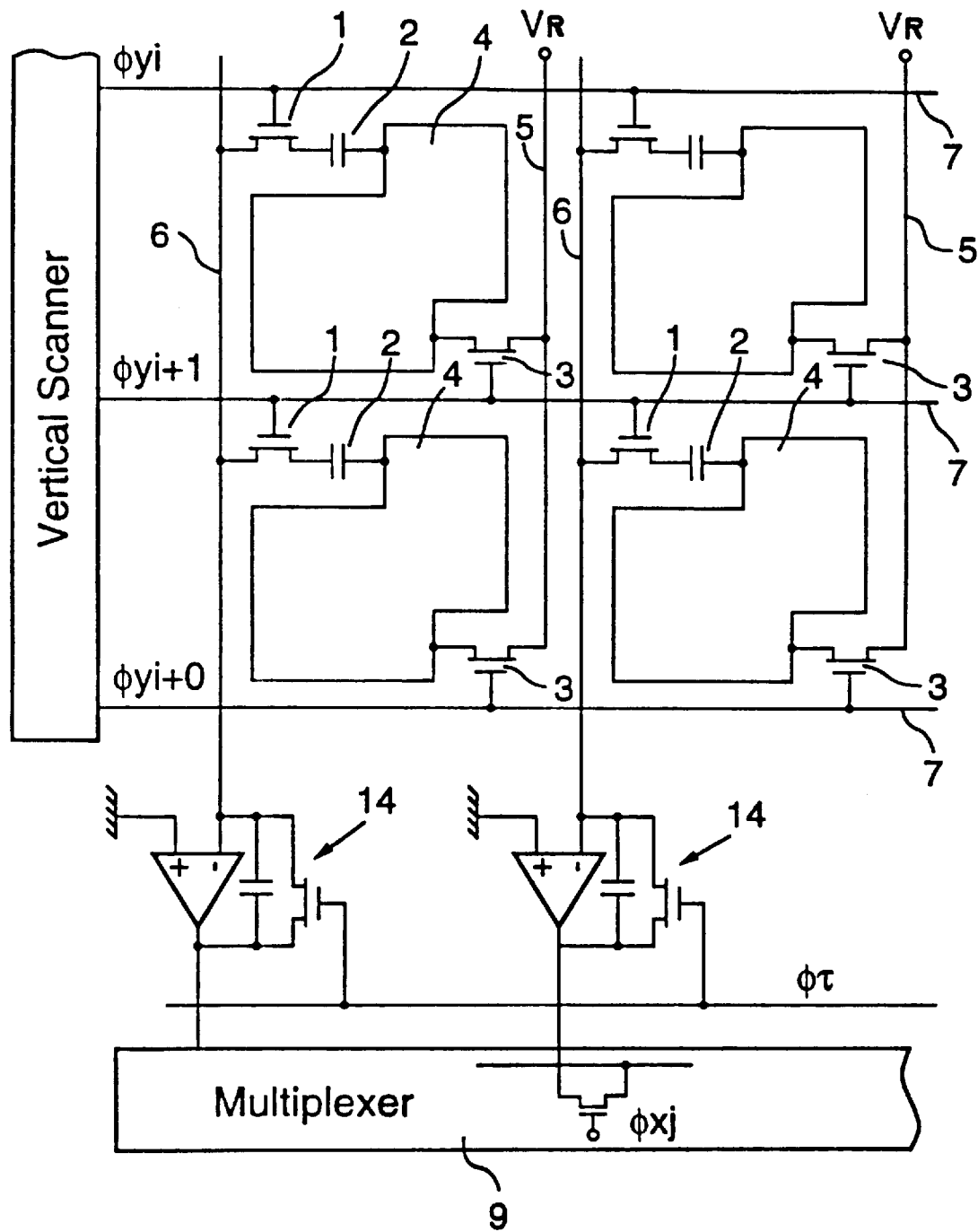
FIG. 3 is a schematic diagram of an imaging sensor array incorporating multiple pixels in accordance with the present invention.

Turning now to FIG. 3, a plurality of sensor pixels are shown (i.e. four such pixels are shown in the representative array of FIG. 3, although in practice, a typical array would comprise a plurality of pixels arranged in a rectangular array).

In the embodiment of FIG. 3, reset switch 3 is fabricated as a TFT which is connected to one terminal of radiation detector 4 (the other terminal not shown, but overlying the entire sensor array and connected to a source of high DC bias voltage, as discussed in greater detail below with reference to FIGS. 5–9). The other terminal of each reset switch 3 is connected to a reset source line 5 connected to the reset potential $V_R$.

As discussed above, successive ones of control lines 7 are connected to a vertical scanner a for generating control pulses on successive ones of the control lines 7, as discussed in greater detail below with reference to FIG. 11.

A read-out circuit is provided in the form of a multiplexer 9 having a plurality of charge integration amplifiers 14 connected to a plurality of inputs thereof. Each amplifier 14 is connected to one of the data lines 6 of the sensor array, for integrating charge carried by the data lines in a well known manner, and applying an output signal representative thereof to the multiplexer 9. The multiplexer 9 then multiplexes successive rows of the scanned sensors into a serial output stream for subsequent processing (e.g. A/D conversion, digital signal processing, image display, etc.). The operation of the charge integration amplifiers 14, vertical scanner 8 and multiplexer 9 will be well known to a person of ordinary skill in the art.

Figure 11:
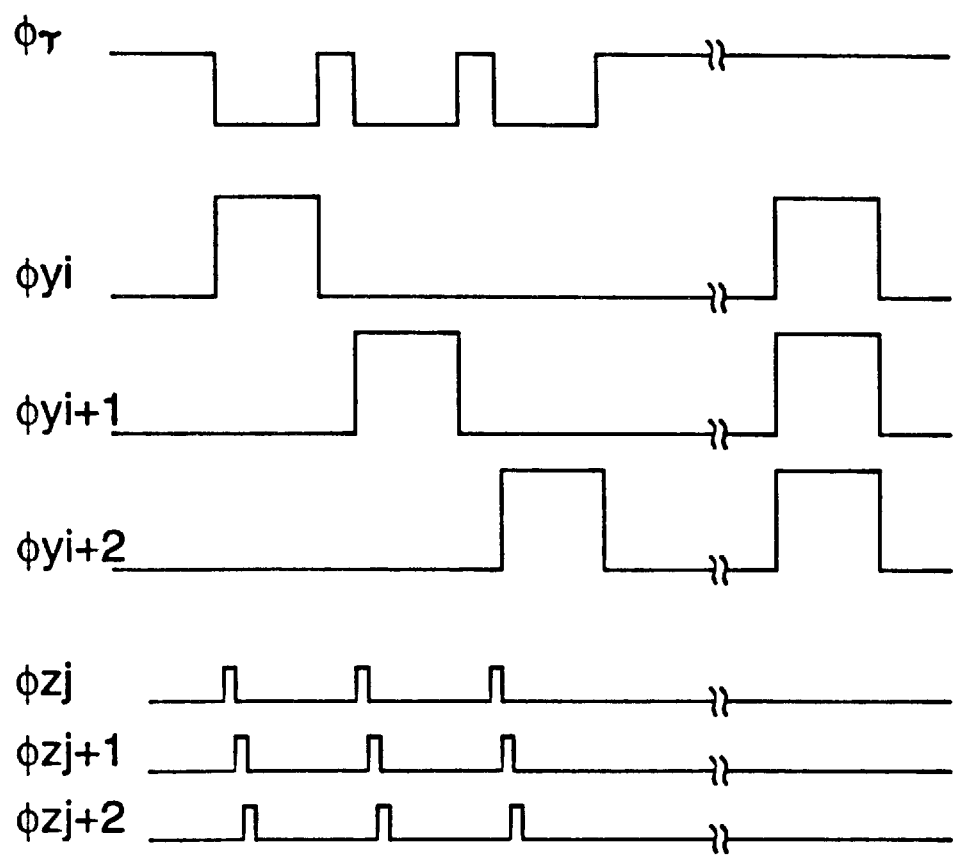
FIG. 11 is a timing diagram for the sensor array shown in FIG. 3.

Turning now to FIG. 11 in conjunction with FIG. 3, operation of the sensor array is briefly described. FIG. 11 depicts the control signals generated by vertical scanner 8, as well as readout and refresh signals generated by an additional control circuit (not shown, but of standard design). Charges stored on the capacitors 2 are transferred to the data line 6 on a row-by-row basis in response to scanner 8 enabling successive rows of the TPT readout switches 1. Thus, as shown in FIG. 11, the first row of readout switches 1 is enabled in response to vertical scanner 8 generating a control pulse ($\phi$yi).

The charge transferred from each storage capacitor 2 to the data line 6 is then integrated via the charge integration amplifiers 14 and is applied to multiplexer 9.

The charges applied to multiplexer 9 by respective ones of the amplifiers 14, are multiplexed and read out of multiplexer 9 in serial format in response to the external controller generating a plurality of successive additional control signals $\phi$xj, $\phi$xj+1, $\phi$xj+2, etc., so that the image data appearing on each pixel sensor is read out in succession (i.e. serial output). The integration capacitors of charge integration amplifiers 14 are then reset in response to the external control circuit generating a positive refresh pulse signal ($\phi$r).

Next, the second row of storage capacitors 2 is discharged in response vertical scanner 8 generating another control pulse ($\phi$yi+1) on the second row of pixel sensors,. for transferring charge to the data lines 6, which charges are then integrated via amplifiers 14 and applied to multiplexer 9 for subsequent readout. However, as will be apparent from FIG. 3, when the control pulse $\phi$yi+1 is generated, the TFT reset switches 3 are also enabled in the previous row, for resetting the potential of the radiation detectors 4 of the entire previous row.

Note that the reset action at this time cannot completely refresh the storage capacitor 2, since the TFT switch 1 of the previous row has turned off, and therefore the terminal of capacitor 2 on switch 1 side is floated electrically and its potential varies with the potential on the opposite terminal. A complete reset operation for the capacitor 2 is carried out after all of the pixels on the imaging panel have been read out.

This readout and reset process continues for all subsequent rows of the sensor array in response to the vertical scanner generating successive additional control pulses (e.g. $\phi$yi+2, etc.) on successive control lines 7 of the array.

Once vertical scanner 8 has caused charges on each row of the sensor to be readout (i.e. after one frame image), vertical scanner 8 generates a further high voltage level control pulse to all control lines 7, thereby resetting all pixels at one time.

Figure 4:
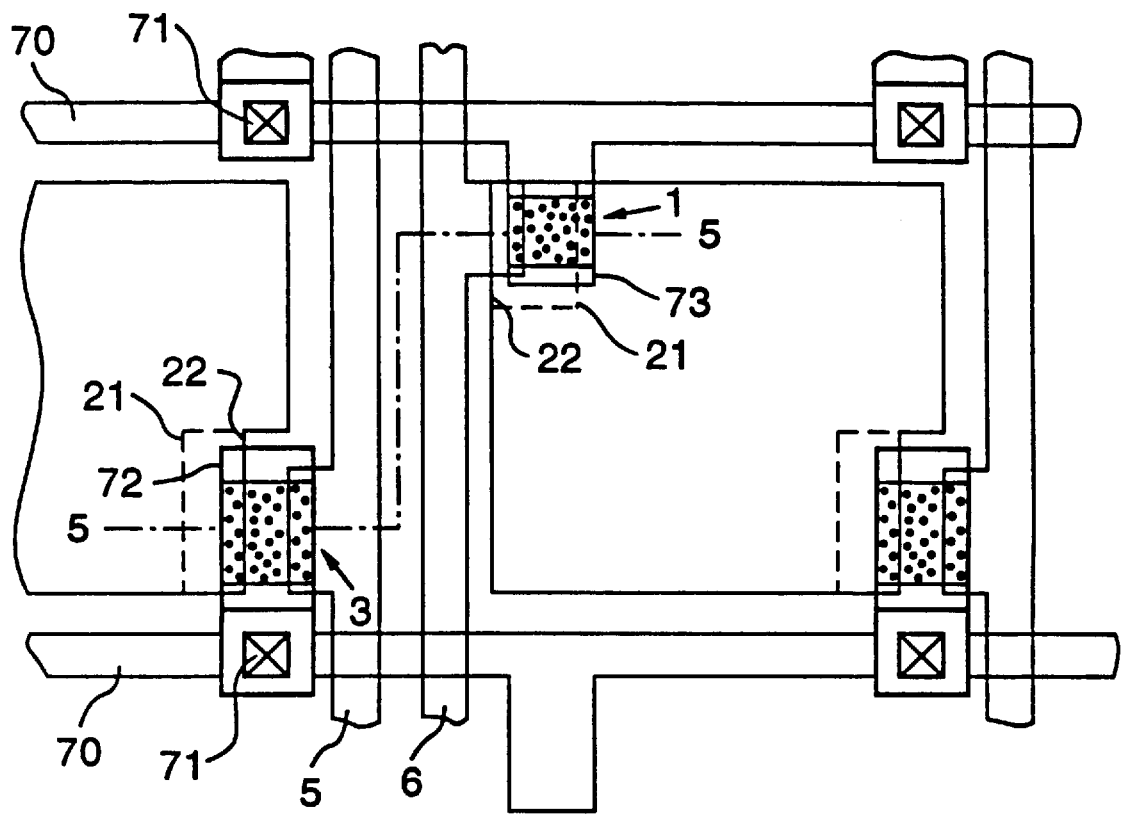
FIG. 4 is a schematic layout of a single pixel according to the preferred embodiment.
Figure 5:
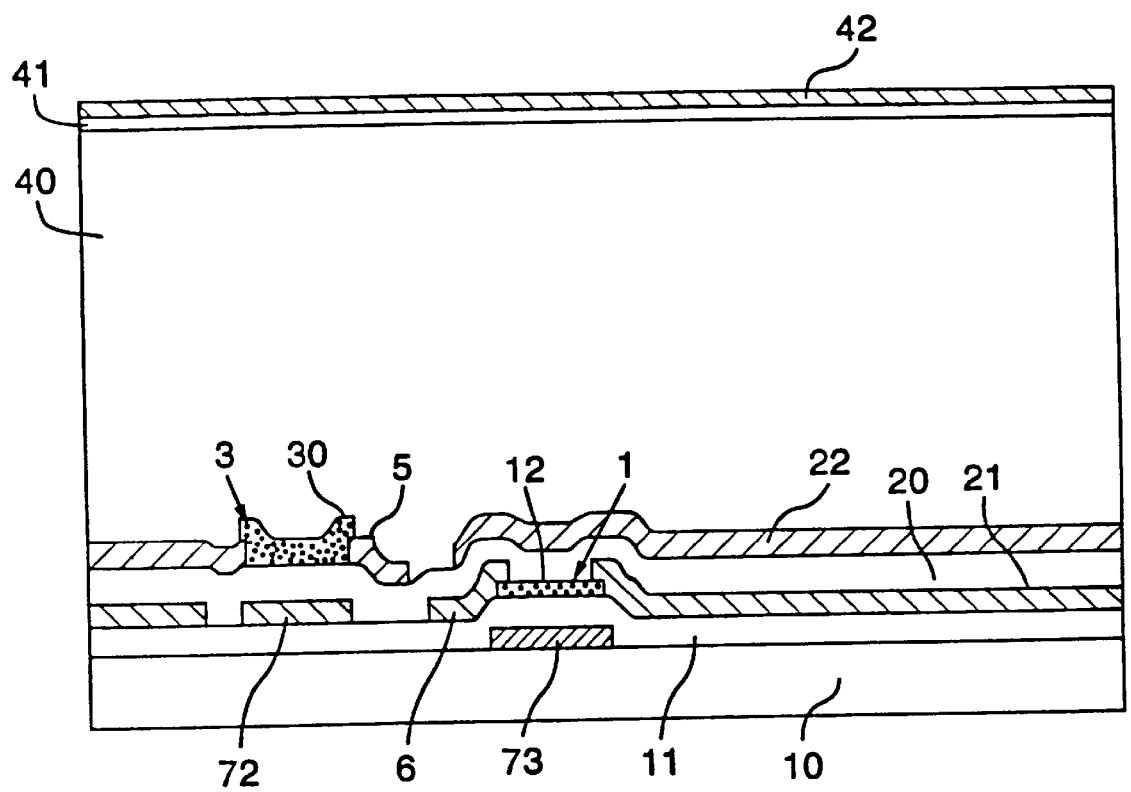
FIG. 5 is a cross-section through the line A–B in FIG. 4.

Turning now to FIGS. 4 and 5, a layout of one pixel and a cross section through the pixel, respectively, are shown, in accordance with the preferred embodiment.

As discussed above with reference to FIGS. 2 and 3, the sensor array is defined by a plurality of rows of control lines 7 (represented in FIG. 4 by gate bus lines 70), and a plurality of columns of data lines 6. The lines 70 and 6 are preferably fabricated from Cr, in the usual manner. The gate lines 70 are deposited on a glass substrate 10 with individual gates 73 extending into the active pixel area. A layer of insulator 11 (e.g. $SiO_2$ or a-SiN) is deposited over the gate 73 and substrate 10. Individual Cr gates 72 of the reset switch 3 are deposited on the insulation layer 11 and contact the control lines 70 via contact vias 71.

A layer of CdSe semiconductor 12 is deposited on insulation layer 11 so as to overlay the gate 73 of readout switch 1. Data lines 6 (also fabricated from Cr) and lower pixel electrodes 21 (also fabricated from Cr) are deposited on insulating layer 11 so as to contact the semiconductor region 12. A further insulation layer 20 of a-SiN is deposited over the gate 72 of reset switch 3, data line 6, semiconductor region 12, lower pixel electrode 21 and the underlying insulation layer 11.

Source line 5 for the reset switch 3 and upper pixel electrode 22 are then deposited on the insulating layer 20, and a further semiconductor region 30 (preferably CdSe) is deposited so as to contact source line 5 and upper pixel electrode 22, and so as to be substantially aligned with the gate 72 of reset switch 3.

Next, a layer 40 of a a-Se is deposited over the entire array, followed by a blocking layer 41 of $CeO_2$ and an upper electrode or contact 42 of Al which, in combination with upper pixel electrode 22, is used to apply a high DC bias voltage to the a-Se layer 40.

Because the second gate dielectric film 20 (preferably fabricated from a-SiN) is made thick (e.g. 500 nm to 1000 nm) with high permittivity (e.g. approximately 9), the breakdown voltage between the pixel electrode 22 and the TFT readout switch 1 is extremely high.

As discussed above, the collection efficiency of signal charge is given by Cs/(Cs+Cse). Because the thickness of the Se film 40 for radiation detection can be on the order of 300 $\mu$m, over 98% of signal charge can be readout according to the design of the present invention.

The TFT structure shown in FIGS. 4 and 5 is just one of a number of various TFT structures which are suitable for realizing the present invention.

Figure 6:
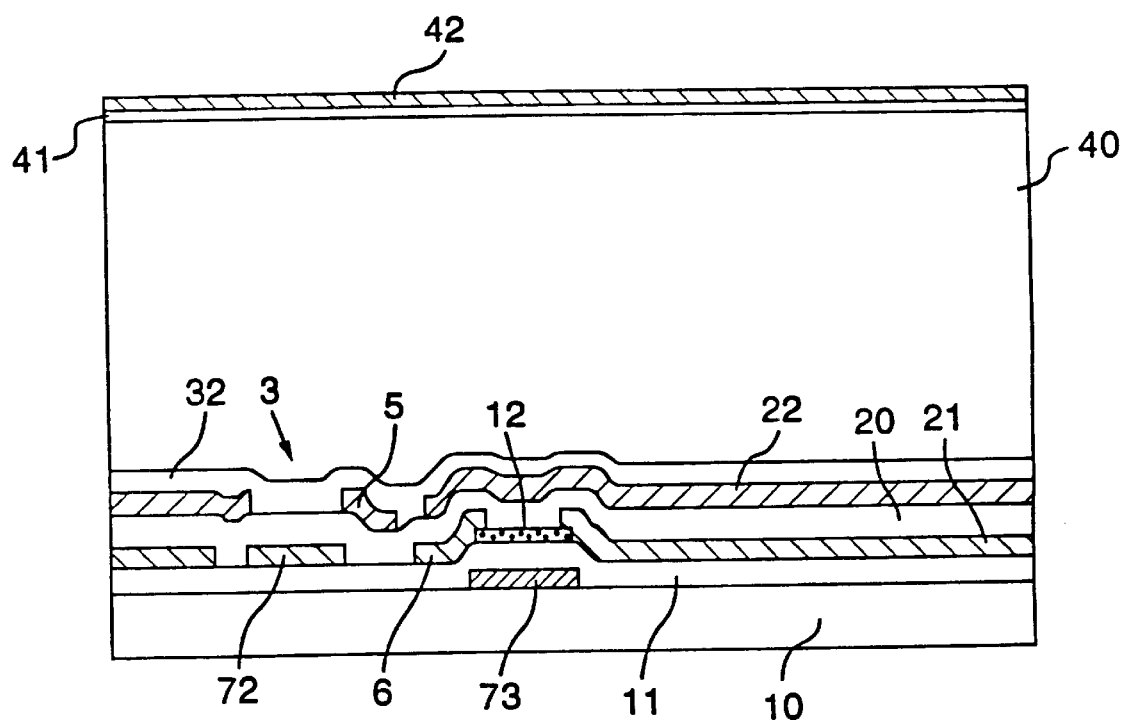
FIG. 6 is a cross-section view of a single pixel according to a first alternative embodiment of the invention.
Figure 7:
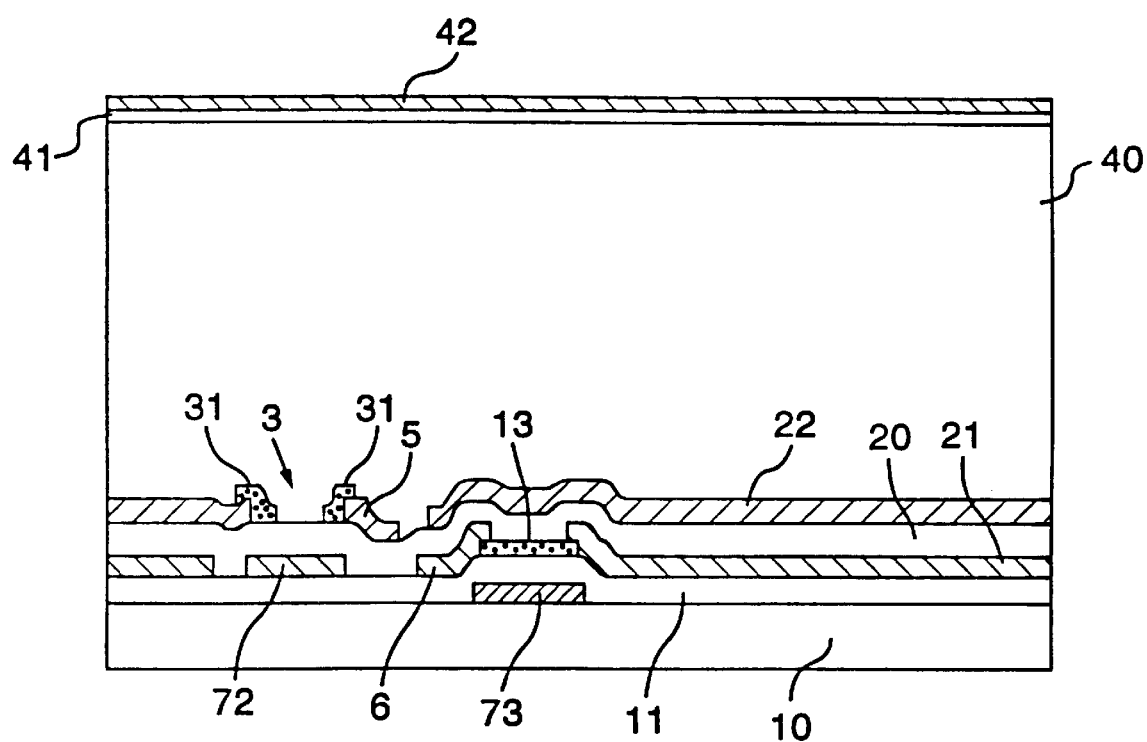
FIG. 7 is a cross-section view of a single pixel according to a second alternative embodiment of the invention.
Figure 8:
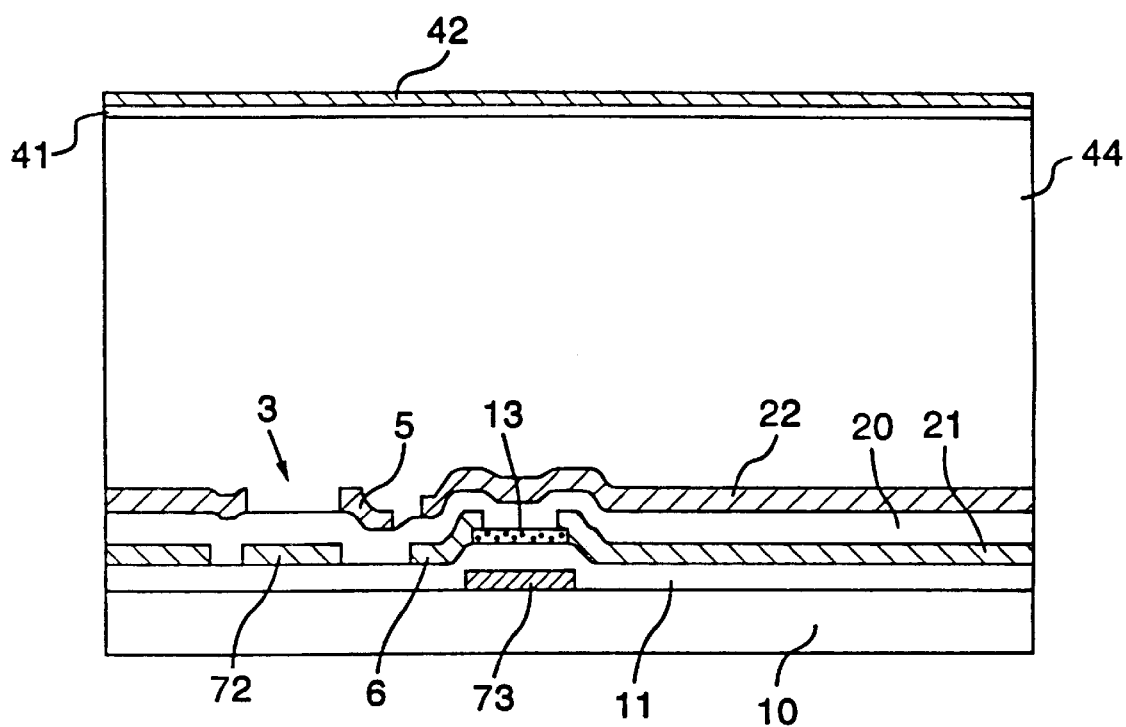
FIG. 8 is a cross-section view of a single pixel according to a third alternative embodiment of the invention.

FIGS. 6, 7, and 8 show cross-sectional views with different structure of the reset TFT 3. Reference numerals which are common to FIGS. 5–8 represent common features. Thus, in the alternative embodiment of FIG. 6, a TFT reset switch 3 is fabricated using a semiconductor layer 32 of a-Se+$As_2Se_3$. In the embodiment of FIG. 7, the reset switch 3 is fabricated using a P channel TFT device with semiconductor region 31 of $p^+$-a-Si, and wherein the semiconductor material 13 for readout switch 1 is fabricated using a-Si. In the embodiment of FIG. 8, the reset switch 3 is fabricated as a TFT device, the semiconductor film of radiation conversion 4 is also used for the TFT switch 3. The semiconductor region 13 of readout switch 1 being fabricated from a-Si, as is the radiation detection film 44.

Figure 9:
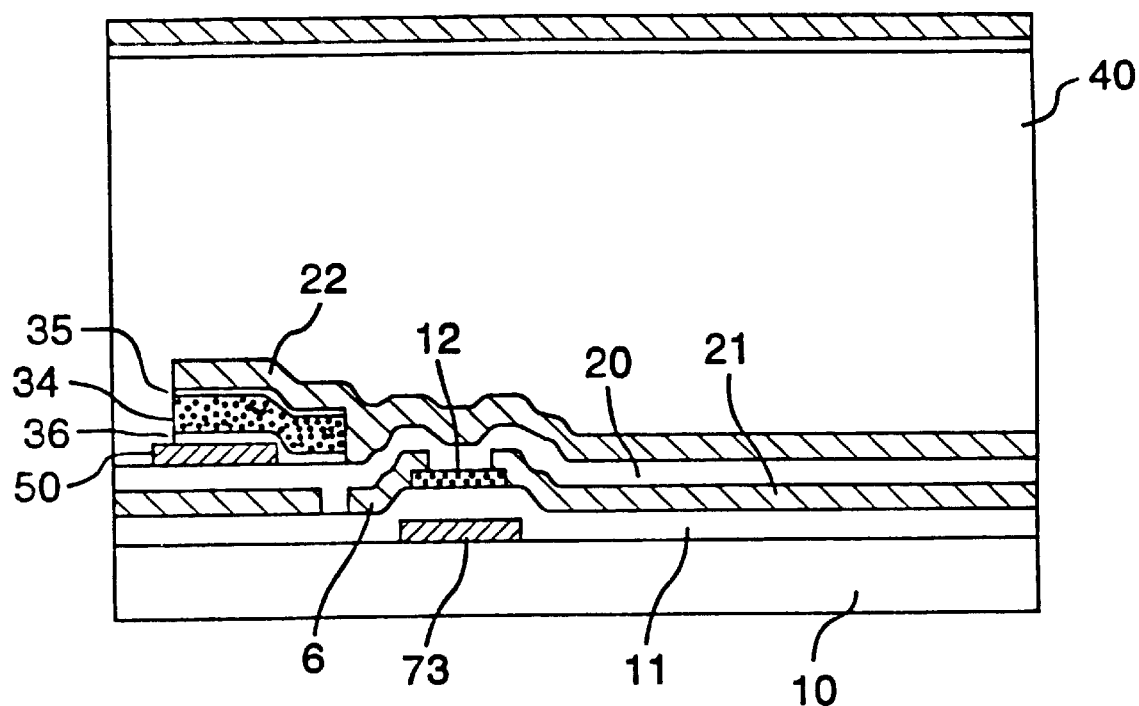
FIG. 9 is a cross-section view of a single pixel according to a fourth alternative embodiment of the invention.

FIG. 9 shows another structure of the invention, employing a a-Si p-i-n diode switch as the reset switch 3. The diode comprises a layer 34 of a-Si sandwiched between a layer 35 of $p^+$-a-Si and a layer 36 of $n^+$-a-Si. The diode is deposited on a reset control line 50 of Cr.

Figure 10:
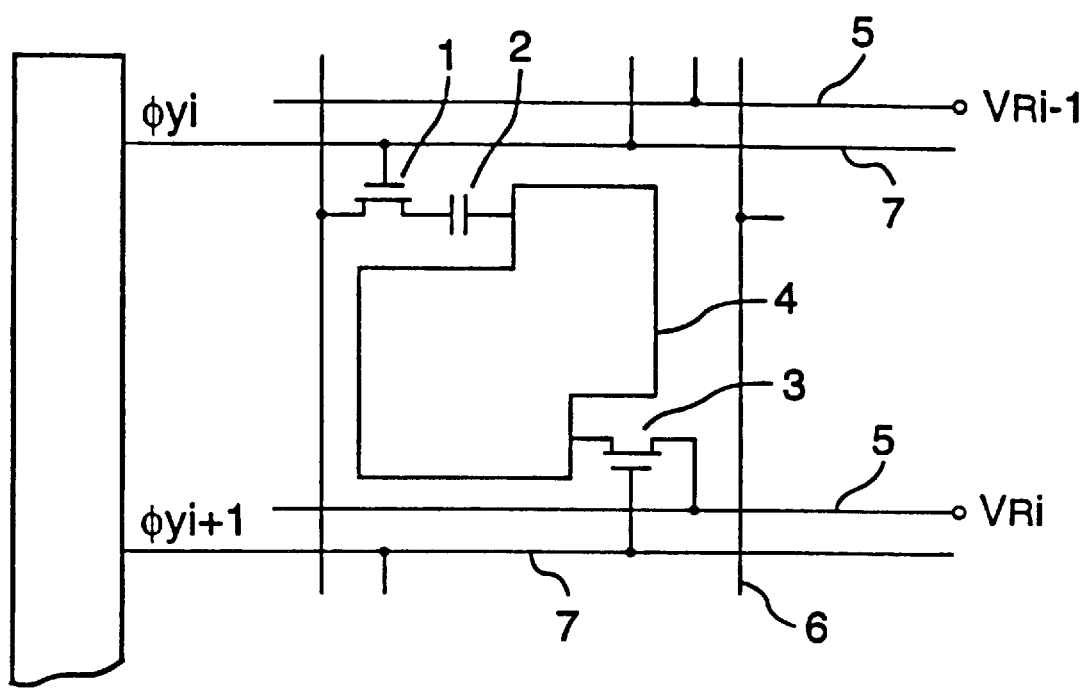
FIG. 10 is a schematic diagram of a sensor array according to a further alternative embodiment.

FIG. 10 shows a further alternative embodiment of the invention wherein the source lines 5 for the reset switches 3 are arranged parallel to the gate lines 7.

This design allows a driving pulse wave, which is synchronous with the gate contral pulse, but with different voltage levels to be applied to the source line 5, in order to increase the on-current and reduce the off-current of the reset switch 3.

Alternative embodiments and variations of the invention are possible. For example, although the embodiments described above refer to a well known multiplexer readout, alternative readout circuits and devices may be utilized, such as a TFT readout array with built-in TFT amplifier in each pixel, laser beam scanning readout; spatial light modulator readout (i.e. light valve) employing liquid crystal or solid-state image intensifiers with electric luminance film, etc. All such variations and alternative embodiments are believed to be within the sphere and scope of the present invention as defined by the claims appended hereto.

I claim:

1. A radiation imaging system comprising:
   a) capacitive coupling radiation detector means for directly converting incident radiation to electrical charges;
   b) an array of storage capacitor means connected to said capacitive coupling radiation detector means for storing said charges;
   c) a plurality of readout means connected to respective ones of said storage capacitor means for successively outputting said charges stored on said respective storage capacitor means, wherein each of said readout means comprises a thin film transistor (TFT); and
   d) a plurality of reset means connected to said respective ones of said storage capacitor means for resetting successive adjacent ones of said respective storage capacitors in synchronism with said outputting of said charges, thereby rapidly discharging said capacitive coupling radiation detector means.

2. The imaging system of claim 1, wherein said capacitive coupling radiation detector means comprises a high-voltage DC biased a-Se film.

3. The imaging system of claim 2, wherein said a-Se film is approximately 300 $\mu$m thick.

4. The imaging system of claim 2, wherein each of said storage capacitor means comprises a first electrode adjacent said a-Se film, a second electrode opposite said first electrode, and a dielectric layer between said first electrode and said second electrode.

5. The imaging system of claim 4, wherein each of said thin film transistors (TFT) has a drain terminal connected to said first electrode, a source terminal connected to a data readout line, and a gate terminal connected to a source of readout control signal.

6. The imaging system of claim 5, wherein each of said reset means comprises a diode having an anode thereof connected to said first electrode and a cathode connected to a source of reset control signal.

7. The imaging system of claim 4, wherein each of said reset means comprises a second thin film transistor (TFT).

8. The imaging system of claim 7, wherein said second thin film transistor (TFT) has a drain terminal thereof connected to said first electrode, a source terminal thereof connected to a source of reset potential, and a gate terminal thereof connected to a source of reset control signal.

9. The imaging system of claim 1, wherein each of said capacitive coupling radiation detector means comprises a high-voltage DC biased a-Si film.

10. The imaging system of claim 1, wherein each of said reset means comprises a thin film transistor (TFT).

11. The imaging system of claim 1, wherein each of said reset means comprises a diode.

12. The imaging system of claim 11, wherein said diode is an amorphous silicon p-i-n diode.

13. The imaging system of claim 1, wherein each of said reset means comprises a metal-insulator-metal (MIM) transistor.

14. The imaging system of claim 1, wherein each of said reset means comprises a metal-insulator-semiconductor (MIS) transistor.

15. A radiation imaging system comprising:
   a) capacitive coupling radiation detector means for directly converting incident radiation to electrical charges;
   b) an array of pixel electrodes adjacent said capacitive coupling radiation detector means for storing said charges;
   c) a plurality of control lines separating respective rows of said array of pixel electrodes;
   d) a plurality of data lines separating respective columns of said array of pixel electrodes;
   e) scanner means for generating a succession of control signals on successive ones of said control lines;
   f) a plurality of TFT readout switch means having drain terminals connected to respective ones of said pixel electrodes, gate terminals connected to first respective ones of said control lines, and source terminals connected to respective ones of said data lines, for transferring said charges from said pixel electrodes to said data lines in response to said scanner means generating said control signals on said respective ones of said control lines;
   g) multiplexer means connected to said plurality of data lines, for receiving and outputting successive rows of said charges from said data lines; and
   h) a plurality of reset switch means having first terminals thereof connected to said respective ones of said pixel electrodes, control terminals thereof connected to further respective ones of said control lines adjacent said first respective ones of said control lines, and second terminals thereof connected to a source of reset potential for resetting said respective ones of said pixel electrodes after said charges have been transferred therefrom.

16. The radiation imaging system of claim 15, wherein said capacitive coupling radiation detector means comprises a high-voltage DC biased a-Se film.

17. The imaging system of claim 16, wherein said a-Se film is approximately 300 $\mu$m thick.

18. The imaging system of claim 16, wherein each said pixel electrodes comprises a first electrode adjacent said a-Se film, a second electrode opposite said first electrode, and a dielectric layer between said first electrode and said second electrode.

19. The imaging system of claim 18, further comprising a layer of Al overlying said a-Se film, said a-se film being high-voltage DC biased by means of a high DC voltage applied between said layer of Al and said first electrode.

20. The imaging system of claim 19, further comprising a blocking layer of $CeO_2$ intermediate said layer of Al and said a-Se film.

21. The imaging system of claim 16, wherein each said TFT readout switch means is fabricated with an a-Si semiconductor region.

22. The imaging system of claim 21, wherein each said reset switch means comprises an MIS transistor fabricated with $p^+$-a-Si semiconductor.

23. The imaging system of claim 15, wherein said capacitive coupling radiation detector means comprises a high-voltage DC biased a-Si film.

24. The imaging system of claim 23, wherein each said reset switch means comprises an MIM transistor and each said TFT readout switch means is fabricated with an a-Si semiconductor.

25. The imaging system of claim 15, wherein each said reset switch means comprises a thin film transistor (TFT).

26. The imaging system of claim 15, wherein each said reset switch means comprises a diode.

27. The imaging system of claim 26, wherein said diode is an amorphous silicon p-i-n diode.

28. The imaging system of claim 23, wherein each said diode has an anode thereof comprising $p^+$-a-Si connected to one of said pixel electrodes, a cathode comprising $n^+$-a-Si connected to one of said control lines, and a layer of a-Si between said anode and said cathode.

29. The imaging system of claim 15, wherein each said reset switch means comprises a metal-insulator-metal (MIM) transistor.

30. The imaging system of claim 15, wherein each said reset switch means comprises a metal-insulator-semiconductor (MIS) transistor.

31. The imaging system of claim 15, wherein each said TFT readout switch means is fabricated with a CdSe semiconductor region.

32. The imaging system of claim 15, wherein said second terminals of said reset switch means are connected to said source of reset potential via respective reset lines parallel to respective ones of said data lines.

33. The imaging system of claim 15, wherein said second terminals of said reset switch means are connected to said source of reset potential via respective reset lines parallel to respective ones of control lines.

34. A radiation imaging system comprising:
   a) capacitive coupling radiation detector means for directly converting incident radiation to electrical charges;
   b) an array of storage capacitor means connected to said capacitive coupling radiation detector means for storing said charges;
   c) a plurality of readout means connected to respective ones of said storage capacitor means for successively outputting said charges stored on said respective storage capacitor means; and
   d) a plurality of reset means connected to said respective ones of said storage capacitor means for resetting successive adjacent ones of said respective storage capacitors in synchronism with said outputting of said charges thereby rapidly discharging said capacitive coupling radiation detector means, each of said reset means comprising a thin film transistor (TFT).

* * * * *